United States Patent
Lu

(10) Patent No.: US 9,818,494 B2
(45) Date of Patent: Nov. 14, 2017

(54) OPERATION RECORDING CIRCUIT AND OPERATION METHOD THEREOF

(71) Applicant: Nuvoton Technology Corporation, Hsinchu (TW)

(72) Inventor: Chia-Ching Lu, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 279 days.

(21) Appl. No.: 14/445,078

(22) Filed: Jul. 29, 2014

(65) Prior Publication Data

US 2015/0212916 A1 Jul. 30, 2015

(30) Foreign Application Priority Data

Jan. 29, 2014 (TW) .............................. 103103606 A

(51) Int. Cl.
*G06F 11/30* (2006.01)
*G11C 29/46* (2006.01)
*G11C 29/04* (2006.01)

(52) U.S. Cl.
CPC ...... *G11C 29/46* (2013.01); *G11C 2029/0409* (2013.01)

(58) Field of Classification Search
CPC .................. G06F 11/3041; G06F 11/3037
USPC .......................................................... 710/18
See application file for complete search history.

(56) References Cited

U.S. PATENT DOCUMENTS

| | | | |
|---|---|---|---|
| 6,760,864 B2 | 7/2004 | Wood et al. | |
| 8,081,504 B2 | 12/2011 | Chen et al. | |
| 8,113,437 B2 | 2/2012 | Kang | |
| 8,115,188 B2 | 2/2012 | Gosain et al. | |
| 8,219,855 B2 | 7/2012 | Pedersen et al. | |
| 8,270,226 B2 | 9/2012 | Choi et al. | |
| 8,296,496 B2 | 10/2012 | Mogul et al. | |
| 8,477,055 B2 | 7/2013 | Choi et al. | |
| 8,589,764 B2 | 11/2013 | Takeuchi et al. | |
| 8,635,511 B2 | 1/2014 | Takeuchi et al. | |
| 2004/0042251 A1* | 3/2004 | Kang ..................... G11C 11/22 365/145 |

(Continued)

FOREIGN PATENT DOCUMENTS

| | | |
|---|---|---|
| CN | 1037633 C | 3/1998 |
| CN | 101478031 | 7/2009 |

(Continued)

*Primary Examiner* — Idriss N Alrobaye
*Assistant Examiner* — Brooke Taylor
(74) *Attorney, Agent, or Firm* — JCIPRNET

(57) ABSTRACT

An operation recording circuit and an operation method thereof are provided. The operation recording circuit includes a pin monitor unit, a memory unit, a data writing unit, a mode verification unit and a data dumping unit. The pin monitor unit monitors at least one first type pin of an integrated circuit (IC) to correspondingly provide a monitor signal. The data writing unit writes at least one monitor records into the memory unit according the monitor signal. When receiving a test dump command through at least one second type pin of the IC, the mode verification unit correspondingly provides a dump control signal. The data dumping unit determines whether to output the at least one monitor records from the memory unit through the at least one second type pin or not according to the dump control signal.

17 Claims, 7 Drawing Sheets

(56) References Cited

U.S. PATENT DOCUMENTS

| | | | |
|---|---|---|---|
| 2008/0320347 A1* | 12/2008 | Cussonneau | G01R 31/31703 714/723 |
| 2009/0106611 A1* | 4/2009 | Wu | G06F 11/2236 714/726 |
| 2012/0042200 A1 | 2/2012 | Takeuchi et al. | |
| 2012/0068985 A1* | 3/2012 | Tsai | G06F 11/2284 345/211 |
| 2012/0303870 A1 | 11/2012 | Park et al. | |
| 2013/0027079 A1 | 1/2013 | Nazarian et al. | |
| 2013/0027081 A1 | 1/2013 | Nazarian et al. | |
| 2015/0170761 A1* | 6/2015 | Jeong | G11C 29/46 365/201 |

FOREIGN PATENT DOCUMENTS

| | | |
|---|---|---|
| CN | 102169719 | 8/2011 |
| CN | 102412827 | 4/2012 |
| KR | 101031420 | 4/2011 |
| KR | 20110057839 | 6/2011 |

* cited by examiner

OPERATION RECORDING CIRCUIT AND OPERATION METHOD THEREOF

CROSS-REFERENCE TO RELATED APPLICATION

This application claims the priority benefit of Taiwan application serial no. 103103606, filed on Jan. 29, 2014. The entirety of the above-mentioned patent application is hereby incorporated by reference herein and made a part of this specification.

BACKGROUND

Field of the Invention

The present invention relates to an integrated circuit. More particularly, the embodiments of the present invention relates to an operation recording circuit applied to an integrated circuit and an operation method thereof.

Description of Related Art

In this high-tech generation, demands for integrated circuit (IC) are significantly increased, and there are billions of ICs manufactured in each day. When being packaged and manufactured, an IC is generally checked by a function test to ensure whether the functions of the manufactured IC are normal. When the functions of the IC are abnormal, an engineer commonly checks the design of the IC to determine the reason that leads the function to abnormal. However, the abnormal functions of the IC may not be caused by the circuit design, but the engineer is not able to determine issues that are not caused by the circuit design in an environment with no any further information, and as a result, the IC cannot be completed on schedule. Moreover, if an operation state of the IC is monitored by using a testing equipment, time and labor have to be spent on the aforementioned testing, which causes affection the overall cost, and the testing cannot be performed comprehensively.

SUMMARY

According to an embodiment of the invention, an operation recording circuit is provided. The operation recording circuit includes a pin monitor unit, a memory unit, a data writing unit, a mode verification unit and a data dumping unit. The pin monitor unit is coupled to the at least one first type pin to monitor the at least one first type pin and correspondingly provide a monitor signal. The data writing unit is coupled to the pin monitor unit and the memory unit and configured to receive the monitor signal and write at least one monitor records into the memory unit according to the monitor signal. The mode verification unit is coupled to the at least one second type pin and configured to correspondingly provide a dump control signal after receiving a test dump command through the at least one second type pin. The data dumping unit is coupled to the at least one second type pin, the memory unit and the mode verification unit to receive the dump control signal and configured to determine whether to output the at least one monitor records from the memory unit through the at least one second type pin according to the dump control signal.

According to an embodiment of the invention, an operation method of an operation recording circuit includes the following steps. At least one first type pin of an IC is monitored by a pin monitor unit and the pin monitor unit correspondingly provides a monitor signal. At least one monitor records corresponding to the monitor signal is written into a memory unit by a data writing unit. When a test dump command is received by the at least one second type pin of the IC, a dump control signal is correspondingly provided by a mode verification unit. And, whether to output the at least one monitor records from the memory unit through the at least one second type pin or not is determined by a data dumping unit according to the dump control signal.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
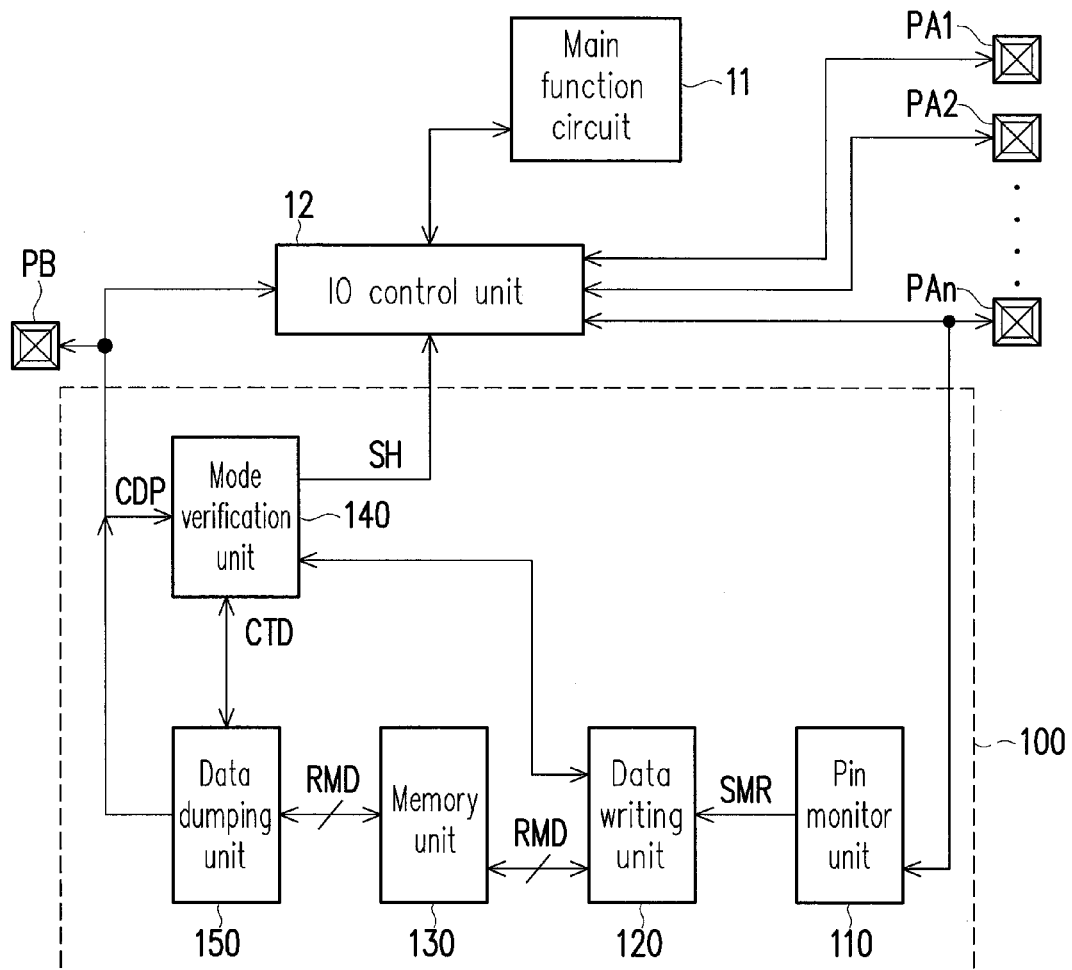
FIG. 1 is a schematic diagram showing a system of an integrated circuit (IC) according to a first embodiment of the invention.

FIG. 1 is a schematic diagram showing a system of an integrated circuit (IC) according to a first embodiment of the invention. Referring to FIG. 1, in the present embodiment, an IC 10 at least includes a main function circuit 11, an input/output (IO) control unit 12, pins PA1 through PAn (corresponding to first type pins), a pin PB (corresponding to a second type pin) and an operation recording circuit 100, where n is a positive integer. The first type pin and the second type pin may be pins of the same type or different type. The IO control unit 12 is coupled to the main function circuit 11, the pins PA1 through PAn and PB. The IO control unit 12 may be controlled by the main function circuit 11 to set IO states of the pins PA1 through PAn and PB. The IO control unit 12 may serve as a transmission route between the main function circuit 11 and the pins PA1 through PAn and PB. In an embodiment, the pins PA1 through PAn and/or PB may be a multi-functional pin and determine a state thereof according to a command received thereby.

The operation recording circuit 100 may include a pin monitor unit 110, a data writing unit 120, a memory unit 130, a mode verification unit 140 and a data dumping unit 150. The memory unit 130 at least includes a non-volatile memory, such as a flash memory, a resistive random access memory (RRAM), a ferroelectric random access memory (FeRAM), a magnetoresistive random access memory (MRAM), a phase change memory (PRAM), a conductive bridge RAM (CBRAM), but the invention is not limited thereto.

In the present embodiment, the pin monitor unit 110 may be coupled to the pin PAn to monitor an operation log, such as a voltage level, a current level or other information (a control signal, a data signal or the like) and the changes with respect to the levels or information (e.g., how the levels or information changes with time) of the pin PAn, and correspondingly provide a monitor signal SMR according to a monitor result. In an embodiment, the aforementioned control signal, the data signal or the changes thereof may also be presented in a form of a voltage level, a current level or changes of the voltage level and the current level. The data writing unit 120 is coupled to the pin monitor unit 110 and the memory unit 130. The data writing unit 120 is configured to receive the monitor signal SMR and write at least one monitor records RMD into the memory unit according to the monitor signal SMR. The mode verification unit 140 is coupled to the pin PB, the IO control unit 12, the data writing unit 120 and the data dumping unit 150. The mode verification unit 140 can provide a dump control signal CTD to the data dumping unit 150 and a pin lock signal SH to the IO control unit 12. The data dumping unit 150 is coupled to the pin PB, the memory unit 130 and the mode verification unit 140 to receive the dump control signal CTD.

When the mode verification unit 140 does not receive a test dump command CDP through the pin PB, it may indicate that the IC 10 does not yet enter a test mode, and the mode verification unit 140 may disable the dump control signal CTD, such that the data dumping unit 150 is in an idle state (i.e., the data dumping unit 150 does not perform data reading) and disables the pin lock signal SH to allow the IO control unit 12 operating normally. When the mode verification unit 140 receives the test dump command CDP through the pin PB, it may indicate that the IC 10 is about to enter the test mode, and the mode verification unit 140 may enable the dump control signal CTD, such that the data dumping unit 150 is in an operation state (i.e., the data dumping unit 150 is ready for data reading) and enables the pin lock signal SH to allow the IO control unit 12 to be in an idle state, which prevents a voltage level of the pin PB from being affected by the main function circuit 11 or any other circuit. At this time, the data dumping unit 150 may read all monitor records RMD from the memory unit 130 and output the read monitor records RMD to an external test equipment (e.g., a logic analyzer) through the pin PB. In other embodiments, the pin monitor unit 110 may be further coupled to the pin PB to monitor the operation log on the pin PB, such as a voltage level, a current level or other information (a control signal, a data signal or the like) and the changes with respect to the levels or information (e.g., how the levels or information changes with time) of the pin PB, and correspondingly provide the monitor signal SMR according to a monitor result as the embodiment above does. The data writing unit 120 is configured to receive the monitor signal SMR and write the plurality of monitor records RMD into the memory unit 130 according to the monitor signal SMR. In the present embodiment, when the mode verification unit 140 receives the test dump command CDP through the pin PB, it may indicate that the IC 10 is about to enter the test mode, and as described above, the pin PB serves as an output pin to output the monitor records RMD to the external.

In an embodiment of the invention, when the monitor records RMD are not entirely or partially read from the memory unit 130, the mode verification unit 140 may control the data writing unit 120 not to perform initialization or data writing operation on the memory unit 130, that is, control the data writing unit 120 to perform write protection on the memory unit 130. The mode verification unit 140 may verify through the data dumping unit 150 whether the monitor records RMD exist in the memory unit 130 and whether the monitor records RMD are entirely read from the memory unit 130. In other words, when the monitor records RMD exist in the memory unit 130, the data dumping unit 150 may notify the mode verification unit 140, and the data dumping unit 150 may also notify the mode verification unit 140 when reading all the monitor records RMD from the memory unit 130.

Additionally, after the data dumping unit 150 reads all of the monitor records RMD from the memory unit 130, the mode verification unit 140 may control the data writing unit 120 to clear all the monitor records RMD in the memory unit 130. Alternatively, in another embodiment, the mode verification unit 140 may be directly coupled to the memory unit 130, and in this case, the mode verification unit 140 may directly access the memory unit 130 and clear the monitor records RMD in the memory unit 130.

In the embodiment above, the pin monitor unit 110 may, for example, monitor the pin PAn to provide the monitor signal SMR; however, in part of the embodiments of the invention, the pin monitor unit 110 may monitor part of or all of the pins PA1 through PAn to provide the monitor signal SMR. Meanwhile, the mode verification unit 140 and the data dumping unit 150 may be, for example, collectively coupled to one single pin PB. However, in some embodiments, the mode verification unit 140 and the data dumping unit 150 may be collectively coupled to multiple pins PB, or alternatively, each of the mode verification unit 140 and the data dumping unit 150 may be individually coupled to one pin PB or individually coupled to multiple pins PB, which depends on data transmission modes (e.g., a serial transmission mode or a parallel transmission mode) of the mode verification unit 140 and the data dumping unit 150.

In the present embodiment of the invention, the pins coupled to the mode verification unit 140 and the data dumping unit 150 may be entirely or partially the same, or different from each other. Meanwhile, the pins (e.g., the pins PB) coupled to the mode verification unit 140 and the data dumping unit 150 may be the pins (e.g., the pins PA1 through PAn) monitored by the pin monitor unit 110. Additionally, the pins (e.g., the pins PA1 through PAn) monitored by the pin monitor unit 110 may serve to transmit a control signal, a data signal or a power voltage, which depends on circuit requirements and are not limited in the invention. The pin for transmitting the power voltage may be directly coupled to the main function circuit 11.

Figure 2:
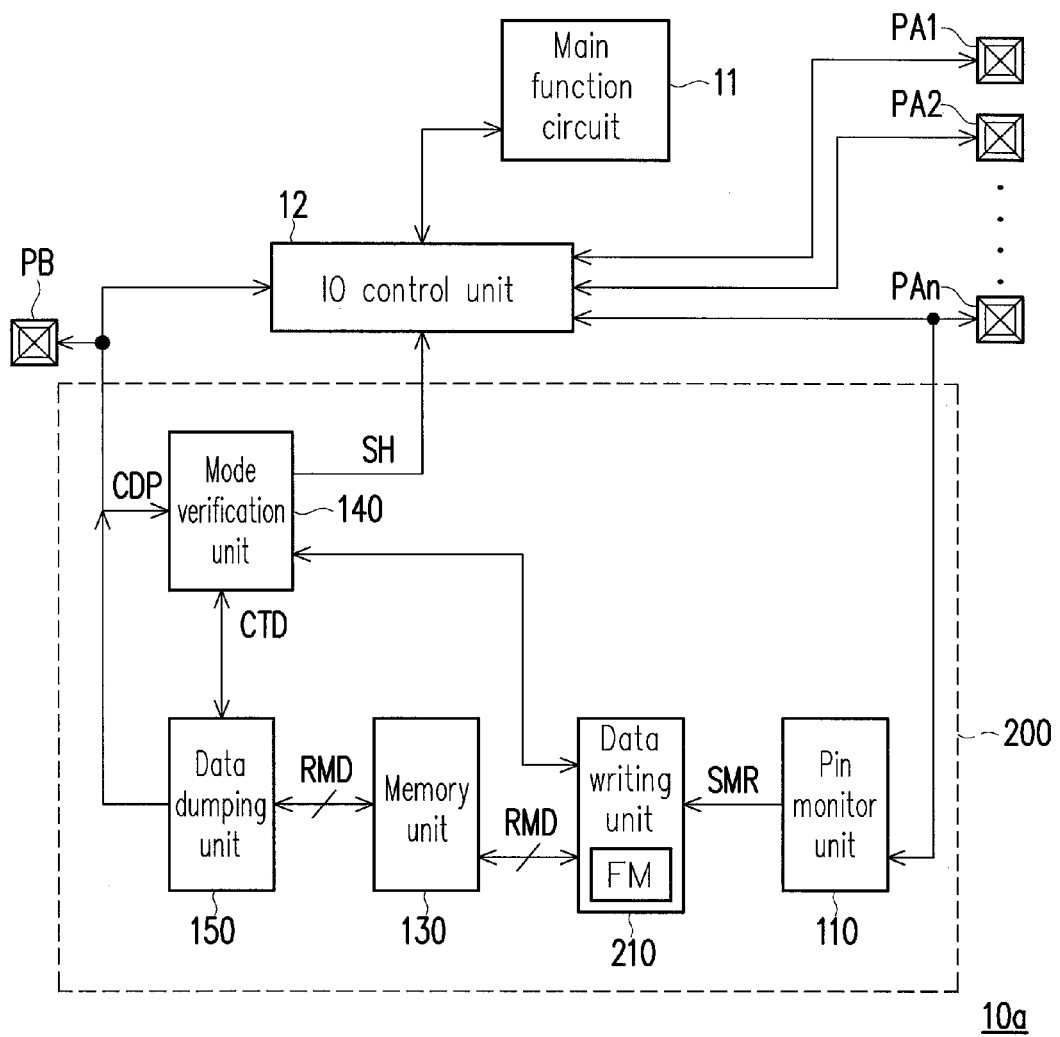
FIG. 2 is a schematic diagram showing a system of an IC according to a second embodiment of the invention.

FIG. 2 is a schematic diagram showing a system of an IC according to a second embodiment of the invention. Referring to FIG. 1 and FIG. 2, the same reference numbers are used to refer to the same or like parts. In the present embodiment, a data writing unit 210 may have a monitor flag FM (which may be a memory element or a register) to record whether monitor records RMD are written into the memory unit 130. The monitor flag FM may be set as a reset state (e.g., a logic level of "0") as default, which may also indicate that no monitor records RMD are written into the memory unit 130. In this case, the data writing unit 210 may perform initialization on the memory unit 130. In other words, when an IC 10a starts to operate, the data writing unit 210 may perform initialization on the memory unit 130 and starts to write data into the memory unit 130.

Then, when writing the monitor records RMD into the memory unit 130, the data writing unit 210 may set the monitor flag FM as a set state (e.g., a logic level of "1") to indicate that there are monitor records RMD written into the memory unit 130. When the monitor flag FM is in the set state, the mode verification unit 140 may determine whether the test dump command CDP is received through the pin PB according to the monitor flag FM. When the mode verification unit 140 receives the test dump command CDP, the data dumping unit 150 may output all the monitor records RMD from the memory unit 130 to an external device through the pin PB and notify the mode verification unit 140 to reset the monitor flag FM in the data writing unit 210.

Figure 3:
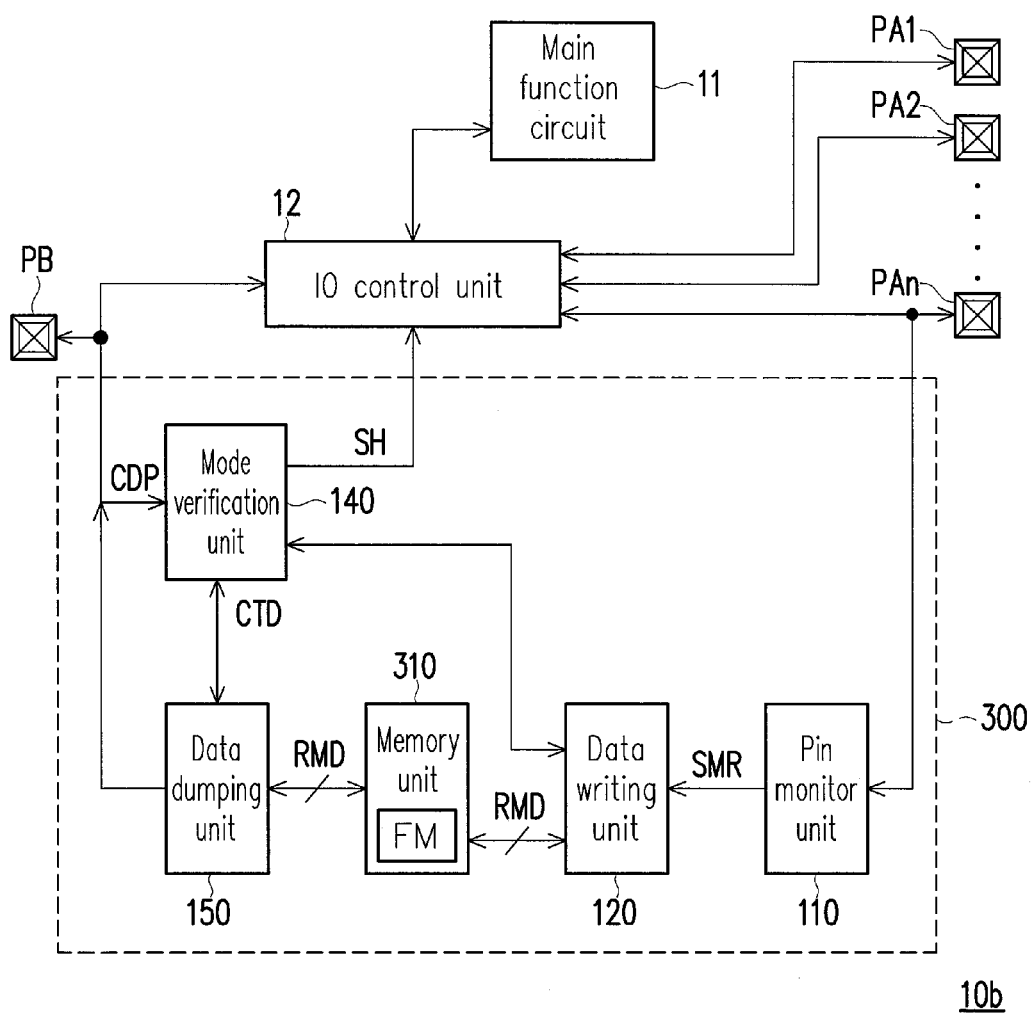
FIG. 3 is a schematic diagram showing a system of an IC according to a third embodiment of the invention.

FIG. 3 is a schematic diagram showing a system of an IC according to a third embodiment of the invention. Referring to FIG. 1 and FIG. 3, the same reference numbers are used to refer to the same or like parts. In the present embodiment, a memory unit 310 may have a monitor flag FM (which may be a memory element or a register) to record whether monitor records RMD are written into the memory unit 310. The monitor flag FM may be set as a reset state (e.g., a logic level of "0") as default, which may also indicate that no monitor records RMD are written into the memory unit 310. In this case, the data writing unit 120 may perform initialization on the memory unit 310. In other words, when an IC 10b starts to operate, the data writing unit 120 may perform initialization on the memory unit 310 and starts to write data into the memory unit 310.

Then, when writing the monitor records RMD into the memory unit 310, the data writing unit 120 may set the monitor flag FM as a set state (e.g., a logic level of "1") to indicate that there are monitor records RMD written into the memory unit 310. When the monitor flag FM is in the set state, the mode verification unit 140 may determine whether the test dump command CDP is received through the pin PB according to the monitor flag FM. When outputting all the monitor records RMD from the memory unit 310 to an external device through the pin PB, the data dumping unit 150 may notify the mode verification unit 140 to reset the monitor flag FM in the memory unit 310. In other words, the data dumping unit 150 may notify the mode verification unit 140 to set the monitor flag FM in the memory unit 310 as a reset status. The mode verification unit 140 may reset the monitor flag FM through the data writing unit 120 or alternatively, the mode verification unit 140 may be directly coupled to the memory unit 310 to reset the monitor flag FM.

Figure 4:
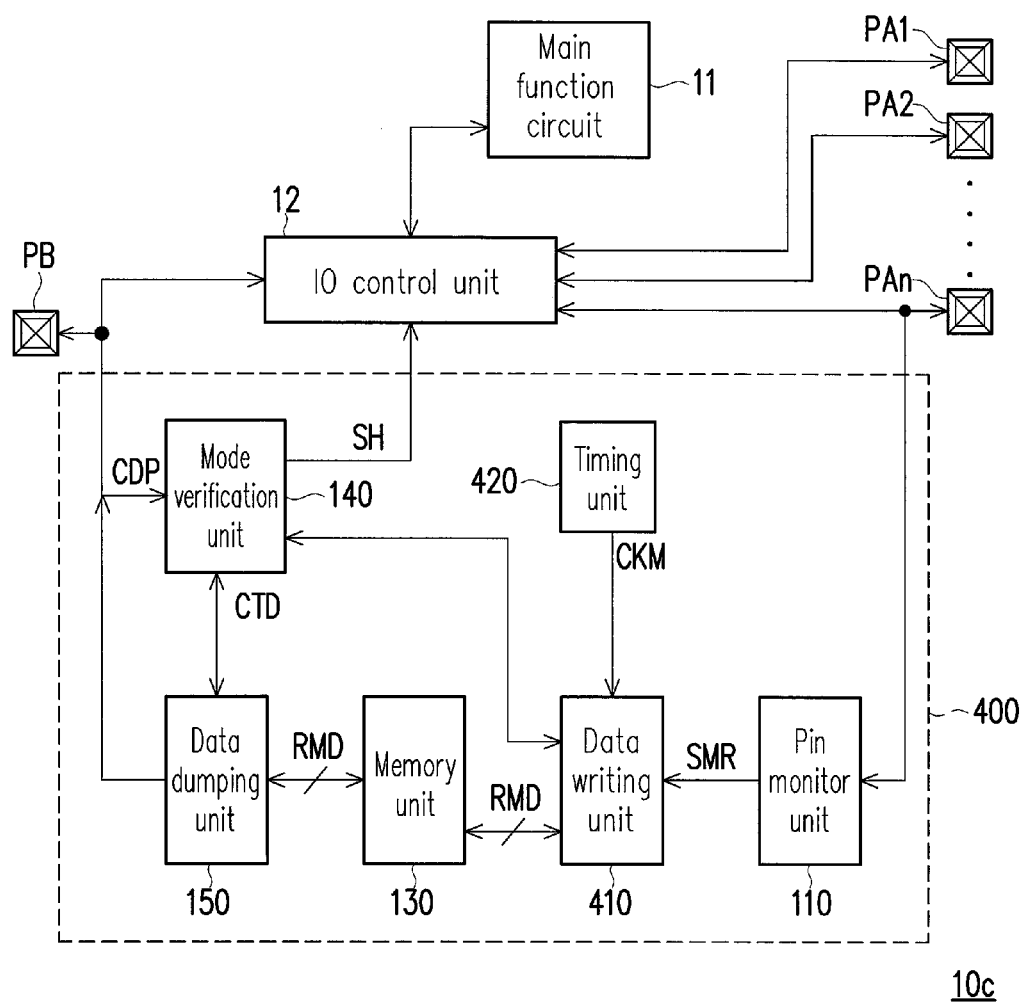
FIG. 4 is a schematic diagram showing a system of an IC according to a fourth embodiment of the invention.

FIG. 4 is a schematic diagram showing a system of an IC according to a fourth embodiment of the invention. Referring to FIG. 1 and FIG. 4, the same reference numbers are used to refer to the same or like parts. An IC 10c may include a timing unit 420. The timing unit 420 may be initialized after the IC 10c starts to operate, so as to reset a state of the timing unit 420.

In the present embodiment, the timing unit 420 is coupled to a data writing unit 410 to provide a monitor timing signal CKM, and the data writing unit 410 may write the monitor records RMD corresponding to the monitor signal SMR into the memory unit 130 according to the monitor timing signal CKM. For example, when being triggered by the monitor timing signal CKM, the data writing unit 410 may write one monitor record RMD currently corresponding to the monitor signal SMR or a plurality of monitor records RMD within a predetermined time period into the memory unit 130 according to the monitor timing signal CKM.

Figure 5:
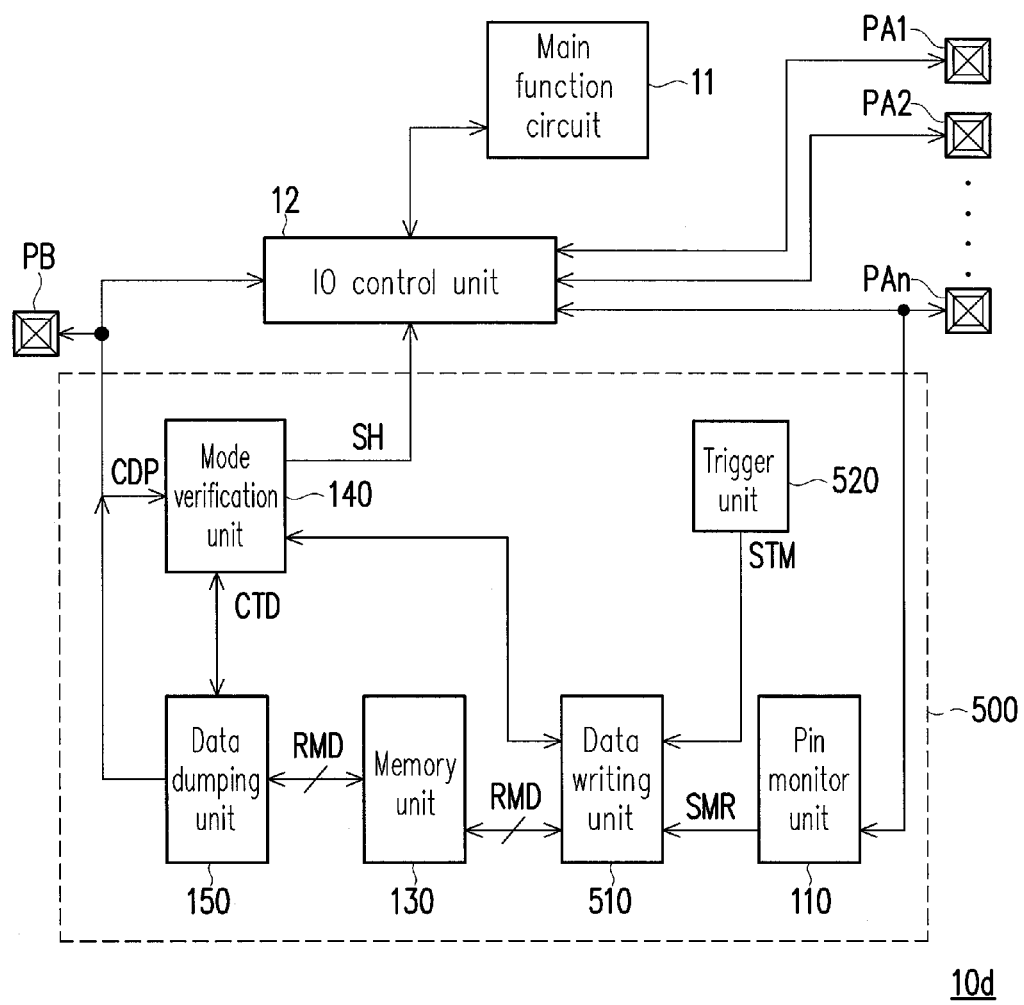
FIG. 5 is a schematic diagram showing a system of an IC according to a fifth embodiment of the invention.

FIG. 5 is a schematic diagram showing a system of an IC according to a fifth embodiment of the invention. Referring to FIG. 1 and FIG. 5, the same reference numbers are used to refer to the same or like parts. An IC 10d may include a trigger unit 520. The trigger unit 520 may be initialized after starting an operation of the IC 10d, so as to reset a state of the trigger unit 520. In the present embodiment, the trigger unit 520 is coupled to a data writing unit 510 to provide a monitor trigger signal STM, and the data writing unit 510 may perform write protection or start data writing on the memory unit 130 according to the monitor trigger signal STM. For example, when the data writing unit 510 is triggered by the monitor trigger signal STM, the data writing unit 510 may immediately stops writing data into the memory unit 130, stops writing data into the memory unit 130 after a predetermined time period, or start to write data into the memory unit 130 according to the monitor trigger signal STM.

In the present embodiment of the invention, the trigger unit 520 may set the monitor trigger signal STM according to an operation state of the IC 10d, that is, when the operation state of the IC 10d satisfies a monitor condition (e.g., that the IC 10d is shutdown or failed), the trigger unit 520 may enable the monitor trigger signal STM. Furthermore, the trigger unit 520 may be coupled to at least one pin (e.g., the pins PA1 through PAn, the pin PB or any other pin which is not shown and corresponding to a third type pin) of the IC 10d to determine the operation state of the IC 10d according to a voltage level of the at least one coupled pin (e.g., the pin PA1).The coupled pins may be determined according to the circuit design, and the embodiments of the invention are not limited thereto.

Figure 6:
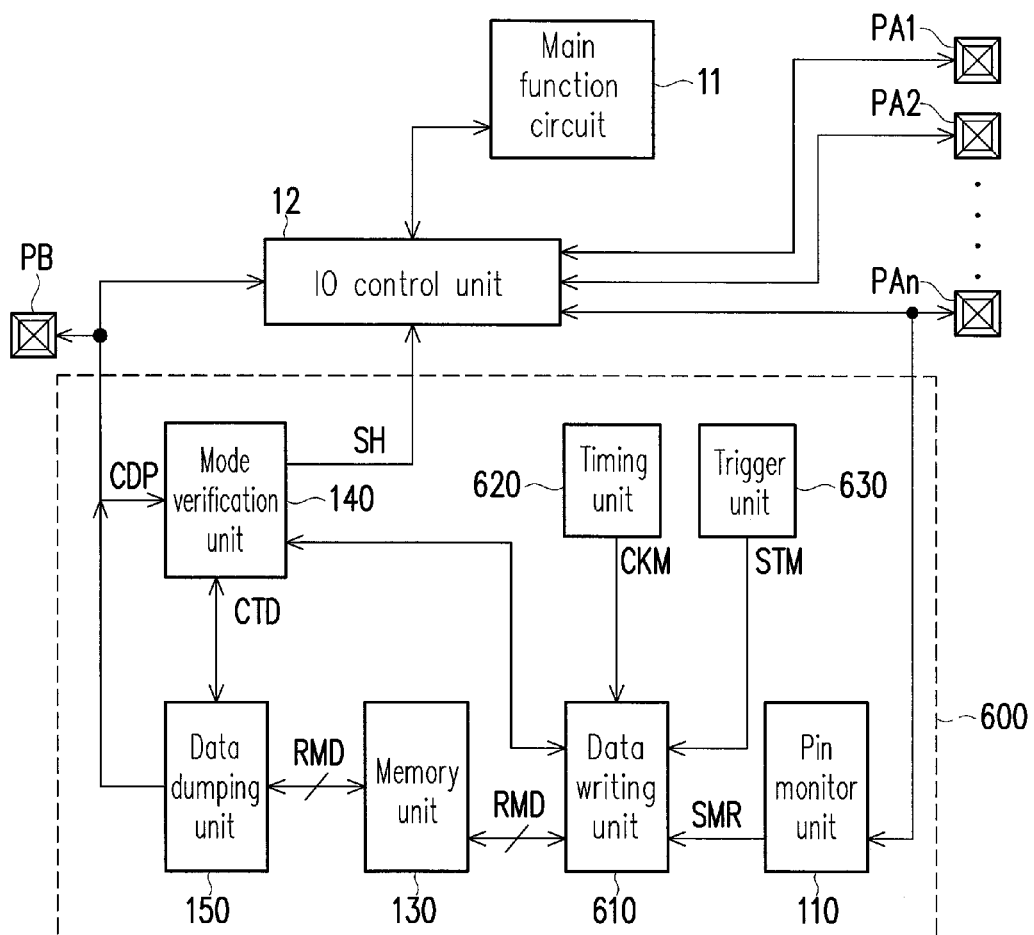
FIG. 6 is a schematic diagram showing a system of an IC according to a sixth embodiment of the invention.

FIG. 6 is a schematic diagram showing a system of an IC according to a sixth embodiment of the invention. Referring to FIG. 1 and FIG. 6, the same reference numbers are used to refer to the same or like parts. An IC 10e may include a timing unit 620 and a trigger unit 630. The timing unit 620 and the trigger unit 630 may be initialized after the IC 10e starts to operate, so as to reset states of the timing unit 620 and the trigger unit 630.

In the present embodiment, the timing unit 620 is coupled to a data writing unit 610 to provide a monitor timing signal CKM, and the data writing unit 610 may write the monitor records RMD corresponding to the monitor signal SMR into the memory unit 130 according to the monitor timing signal CKM. For example, when being triggered by the monitor timing signal CKM, the data writing unit 610 may write one monitor record RMD currently corresponding to the monitor signal SMR or a plurality of monitor records RMD within a predetermined time period into the memory unit 130 according to the monitor signal SMR.

The trigger unit 630 is coupled to the data writing unit 610 to provide the monitor trigger signal STM, and the data writing unit 610 may perform write protection or start data writing on the memory unit 130 according to the monitor trigger signal STM. For example, when the data writing unit 610 is triggered by the monitor trigger signal STM, the data writing unit 610 may stop writing data into the memory unit 130 immediately or after a predetermined time period according to the monitor trigger signal STM.

Furthermore, the data writing unit 610 may perform write protection or start data writing on the memory unit 130 according to the monitor trigger signal STM or the monitor timing signal CKM. For example, in an embodiment, the data writing unit 610 may write one monitor record RMD currently corresponding to the monitor timing signal CKM or a plurality of monitor records RMD within a predetermined time period into the memory unit 130 according to the monitor timing signal CKM. Meanwhile, the data writing unit 610 may immediately stop writing data into the memory unit 130 according to the monitor trigger signal STM to perform write protection on the memory unit 130. In this case, the data writing unit 610 does not write subsequent monitor records RMD into the memory unit 130. Alternatively, in other embodiments, the data writing unit 610 only performs write protection or start data writing on the memory unit 130 only after receiving the monitor trigger signal STM and the monitor timing signal CKM.

Figure 7:
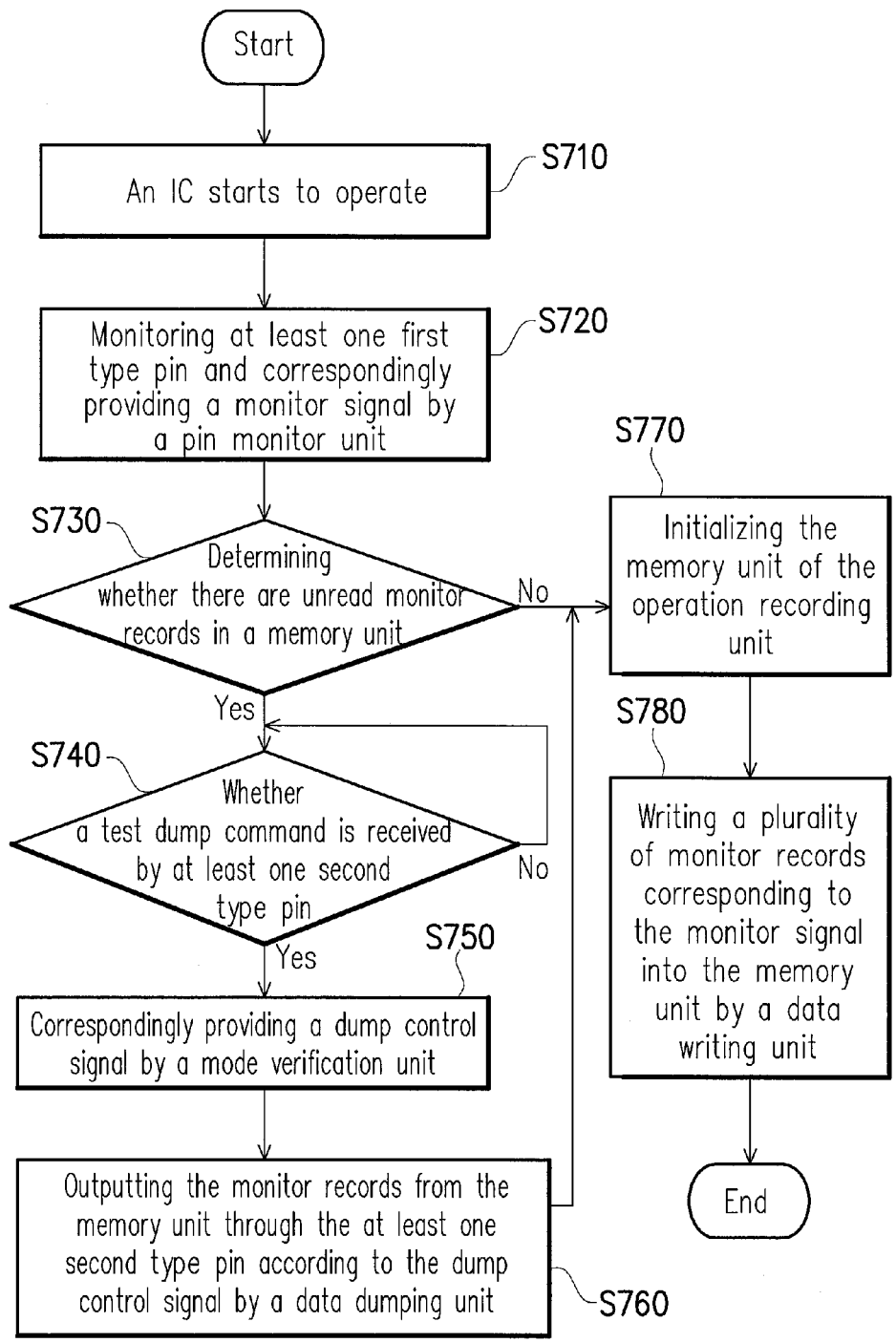
FIG. 7 is a flowchart showing an operation method of an operation recording circuit applicable to an IC according to an embodiment of the present invention.

FIG. 7 is a flowchart showing an operation method of an operation recording circuit applicable to an IC according to an embodiment of the present invention. Referring to FIG. 7, in the present embodiment, the operation method of the operation recording circuit includes the following steps. After an IC starts to operate(step S710), at least one first type pin of the IC is monitored by a pin monitor unit to correspondingly provide a monitor signal (step S720). Then, whether there are unread monitor records in a memory unit is determined (step S730). When there are unread monitor records in the memory unit, i.e., the determination result of step S730 is "Yes", whether a test dump command is received by at least one second type pin is determined (step S740).

When the test dump command is not yet received by the at least one second type pin, i.e., the determination result of step S740 is "No", step S740 is returned to, and the monitor records in the memory unit are protected from being cleared (i.e., to perform write protection). When the test dump command is received by the at least one second type pin, i.e., the determination result of step S740 is "Yes", a dump control signal is correspondingly provided by a mode verification unit (step S750). Then, whether to output the monitor records from the memory unit through the at least one second type pin is determined by a data dumping unit according to the dump control signal (step S760).

When all of the monitor records are read from the memory unit or there are no monitor records in the memory unit, i.e., the determination result of step S730 is "No", the memory unit of the operation recording circuit is initialized (step S770), and then, a plurality of monitoring records corresponding to the monitor signal is written into the memory unit by a data writing unit (step S780). And, after step S760, step S770 is performed. The sequence for performing aforementioned steps is merely an example for the purpose of illustration, but the invention is not limited thereto, and the details of the steps may refer to the description with respect to the embodiments illustrated in FIG. 1 through FIG. 6, which will not be repeated hereinafter.

To sum up, in the operation recording circuit and the operation method thereof according to the embodiments of the invention, the pin monitor unit monitors the at least one first type pin of the IC to generate a plurality of monitor records and stores the monitor records in the memory unit. When the at least one second type pin of the IC receives the test dump command, the data dumping unit outputs the monitor records to an external test equipment through the at least one second type pin. Thereby, the operation states of the pins of the IC can be monitored in all time without significantly increasing testing cost.

Although the invention has been disclosed by the above embodiments, they are not intended to limit the invention. It will be apparent to one of ordinary skill in the art that modifications and variations to the invention may be made without departing from the spirit and scope of the invention. Therefore, the scope of the invention will be defined by the appended claims.

What is claimed is:

1. An operation recording circuit, embedded in an integrated circuit (IC) to be monitored, the operation recording circuit comprising:
   a pin monitor unit, coupled to at least one first type pin of the integrated circuit (IC) to monitor the at least one first type pin and correspondingly provide a monitor signal which indicates a level of an electric signal transmitted on the at least one first type pin during an operation of the integrated circuit, wherein the at least one first type pin is set by a main function circuit, and the main function circuit is embedded in the IC and different from the operation recording circuit;
   a memory unit, wherein the operation of the memory unit is independent from the main function circuit;
   a data writing unit, coupled to the pin monitor unit and the memory unit and configured to receive the monitor signal and write at least one monitor record into the memory unit according to the monitor signal;
   a mode verification unit, coupled to at least one second type pin of the IC and configured to correspondingly provide a dump control signal after receiving a test dump command through the at least one second type pin;
   a data dumping unit, coupled to the at least one second type pin, the memory unit and the mode verification unit to receive the dump control signal and configured to determine whether to output the at least one monitor records from the memory unit through the at least one second type pin according to the dump control signal;
   wherein I/O state of the at least one first type pin and the at least one second type pin is set by an IO control unit which is controlled by the main function circuit, the IO control unit and the main function circuit are located in the IC, and the mode verification unit is further coupled to the IO control unit and outputs a pin lock signal to disable the IO control unit when the at least one second type pin receives the test dump command.

2. The operation recording circuit according to claim 1, further comprising:
   a timing unit, coupled to the data writing unit to provide a monitor timing signal, wherein the data writing unit writes the at least one monitor records corresponding to the monitor signal into the memory unit according to the monitor timing signal.

3. The operation recording circuit according to claim 1, further comprising:
   a trigger unit, coupled to the data writing unit to provide a monitor trigger signal, wherein the data writing unit performs write protection or starts the data writing on the memory unit according to the monitor trigger signal.

4. The operation recording circuit according to claim 3, wherein the trigger unit sets the monitor trigger signal according to an operation state of the IC, and when the operation state of the IC satisfies a monitor condition, the trigger unit enables the monitor trigger signal.

5. The operation recording circuit according to claim 4, wherein the trigger unit is coupled to at least one third type pin of the IC to determine the operation state of the IC according to a voltage level of the at least one third type pin.

6. The operation recording circuit according to claim 1, wherein when the data writing unit writes the at least one monitor records into the memory unit, the data writing unit sets a monitor flag, when the monitor flag is set as a set state, the mode verification unit determines whether the at least one second type pins receives the test dump command according to the monitor flag, and when outputting the at least one monitor records from the memory unit through the at least one second type pin, the data dumping unit notifies the mode verification unit to set the monitor flag as a reset state.

7. The operation recording circuit according to claim 6, wherein the monitor flag is configured in the data writing unit or the memory unit.

8. The operation recording circuit according to claim 6, wherein when the IC starts to operate, and the monitor flag is set as a reset state, the data writing unit performs initialization on the memory unit.

9. An operation method of an operation recording circuit embedded in an integrated circuit (IC) to be monitored, comprising:
   monitoring at least one first type pin of the IC and correspondingly providing a monitor signal by a pin monitor unit, wherein the monitor signal indicates a level of an electric signal transmitted on the at least one first type pin during an operation of the integrated circuit, wherein the at least one first type pin is set by a main function circuit, and the main function circuit is embedded in the and different from the operation recording circuit;
   writing at least one monitor record corresponding to the monitor signal into a memory unit by a data writing unit, wherein the operation of the memory unit is independent from the main function circuit;
   when a test dump command is received by at least one second type pin of the IC, correspondingly providing a dump control signal by a mode verification unit;
   and determining whether to output the at least one monitor record from the memory unit through the at least one second type pin or not according to the dump control signal by a data dumping unit; coupling an IO control unit to the at least one first type pin and the at least one second type pin;
   setting an IO state of the at least one first type pin and an IO state of the at least one second type pin by the IO control which is controlled by the main function circuit;
   and when the test dump command is received by the at least one second type pin, disabling the IO control unit;
   the mode verification unit is further coupled to the IO control unit and outposts a pin lock signal to disable the IO control unit when the at least one second type pin receives the test dump command.

10. The operation method according to claim 9, wherein the pin monitor unit monitors an operation log of the at least one first type pin.

11. The operation method according to claim 9, wherein the step of writing the at least one monitor records corresponding to the monitor signal into the memory unit by the data writing unit comprises:
   writing the at least one monitor records corresponding to the monitor signal into the memory unit by the data writing unit according to a monitor timing signal provided by a timing unit.

12. The operation method according to claim 9, wherein the step of writing the at least one monitor records corresponding to the monitor signal into the memory unit by the data writing unit comprises: performing write protection on the memory unit by the data writing unit according to a monitor trigger signal provided by a trigger unit.

13. The operation method according to claim 12, further comprising:
   when an operation state of the IC satisfies a monitor condition, enabling the monitor trigger signal by the trigger unit.

14. The operation method according to claim 13, further comprising:
   determining the operation state of the IC by the trigger unit according to a voltage level of at least one third type pin of the IC.

15. The operation method according to claim 9, further comprising:
   when the at least one monitor records is written into the memory unit, setting a monitor flag;
   when the monitor flag is set as a set state, determining whether the test dump command is received by the at least one second type pin;
   and when the at least one monitor records is outputted through the at least one second type pin, setting the monitor flag as a reset state.

16. The operation method according to claim 15, further comprising:
   when the IC starts to operate, and the monitor flag is set as a reset state, initializing the memory unit.

17. The operation method according to claim 10, wherein the operation log comprises records with respect to monitoring a voltage level, a current level, a change of the voltage level or a change of the current level on the at least one first type pin for generating the monitor signal.

* * * * *